United States Patent [19]
Yamauchi

[11] Patent Number: 4,547,830
[45] Date of Patent: Oct. 15, 1985

[54] DEVICE FOR PROTECTION OF A SEMICONDUCTOR DEVICE

[75] Inventor: Yoshio Yamauchi, Kyoto, Japan

[73] Assignee: Rohm Company Limited, Kyoto, Japan

[21] Appl. No.: 537,161

[22] Filed: Sep. 30, 1983

Related U.S. Application Data

[63] Continuation of Ser. No. 183,365, Sep. 2, 1980, abandoned.

[30] Foreign Application Priority Data

| Sep. 11, 1979 [JP] | Japan | 54-125247[U] |
| Sep. 11, 1979 [JP] | Japan | 54-125248[U] |
| Dec. 17, 1979 [JP] | Japan | 54-174468[U] |
| Jan. 21, 1980 [JP] | Japan | 55-5626[U] |

[51] Int. Cl.[4] .............................................. H02H 7/20
[52] U.S. Cl. .................................. 361/104; 337/159; 337/160
[58] Field of Search .................. 361/104, 105, 103, 93, 361/1; 337/290, 159, 160, 161, 162, 163, 164, 416, 142, 152, 414, 415, 166, 186, 187, 190, 227, 228

[56] References Cited

U.S. PATENT DOCUMENTS

| 2,895,031 | 7/1959 | Kozacka | 337/159 |
| 3,005,945 | 10/1961 | Salzer | 361/104 X |
| 3,040,237 | 6/1962 | Jones | 361/104 X |
| 3,201,646 | 8/1965 | Mansfield, Jr. | 337/160 X |
| 3,340,430 | 9/1967 | Jenkins | 361/104 |
| 3,405,317 | 10/1968 | Anderson | 361/104 X |
| 3,601,737 | 8/1971 | Baird et al. | 337/159 |
| 3,691,425 | 9/1972 | Weyrich et al. | 361/104 X |
| 3,838,376 | 9/1974 | Norholm | 337/160 X |
| 3,938,067 | 2/1976 | Fister | 337/159 |
| 4,041,435 | 8/1977 | Gaia | 337/159 |
| 4,085,396 | 4/1978 | Augis et al. | 337/159 X |
| 4,186,417 | 1/1980 | Grahame | 361/104 X |
| 4,308,514 | 12/1981 | Kozacka | 337/159 |
| 4,322,704 | 3/1982 | Kozacka | 337/159 |
| 4,375,629 | 3/1983 | Howard | 337/159 |

OTHER PUBLICATIONS

*IBM Tech. Discl. Bull.*, vol. 19, No. 5, "Protection of Printed Circuit Cards".

Primary Examiner—Patrick R. Salce
Attorney, Agent, or Firm—Christensen, O'Connor, Johnson & Kindness

[57] ABSTRACT

A device for protection of a semiconductor device comprises a metallic wire and means for connecting said wire to the output of said semiconductor device, said metallic wire having a characteristic that when a current a little lower than the current that destroys said semiconductor device flows through said wire, said wire is melted in as short a period of time as possible.

3 Claims, 9 Drawing Figures

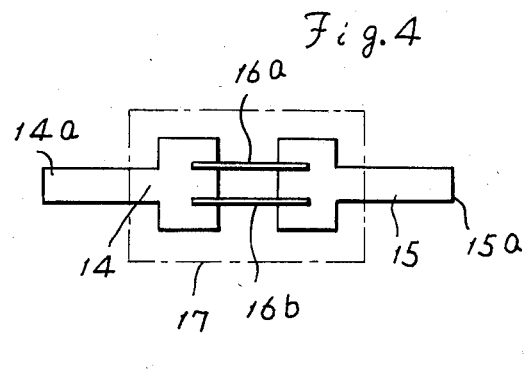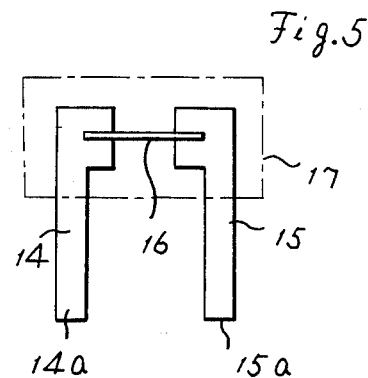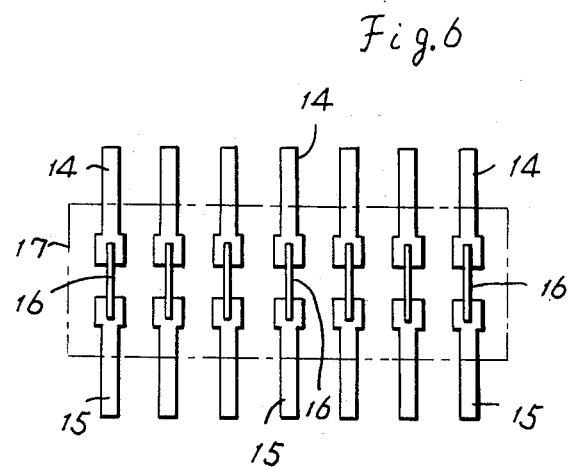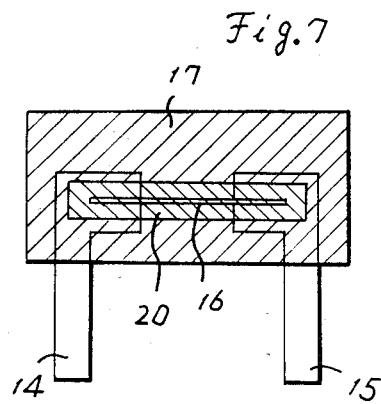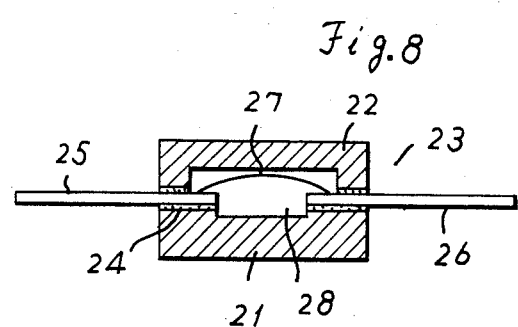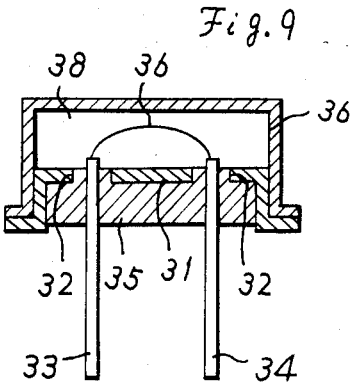

DEVICE FOR PROTECTION OF A SEMICONDUCTOR DEVICE

This application is a continuation/application based on prior copending application Ser. No. 183,365, filed Sept. 2, 1980, "DEVICE FOR PROTECTION OF A SEMICONDUCTOR DEVICE"-Applicant: Yoshio Yamauchi; now abandoned.

This invention relates to a device for protecting semiconductor devices such as power transistors, power integrated circuits and the like, and also a protective element used in the protective device.

When a load is being driven by the output of a semiconductor device such as a power transistor or a power IC, if the load is short-circuited, an overcurrent flows through the semiconductor device to break the device. Repair or replacement of the broken device requires cost, time and labor and causes a great loss.

To protect a semiconductor device against breakdown due to overcurrent, it has been proposed to provide the semiconductor device with a protective circuit which operates in response to overcurrent to prevent it from flowing through the device. However, provision of such a protective circuit in the semiconductor device increases the cost of the device itself and erroneous operation is likely to occur so that proper protection cannot be expected.

Accordingly, it is one object of the present invention to effectively protect semiconductor devices against breakdown due to overcurrent.

Another object of the invention is to accomplish the protection of semiconductor devices from overcurrent by a simple arrangement.

In accordance with the invention, when an overcurrent flows through a load connected to a semiconductor device, the output terminal of the semiconductor device is disconnected from the load. To effect such disconnection a protective element is provided between the load and the semiconductor device to be protected. The protective element comprises a wire made of a metal which is melted and cut when a smaller amount of overcurrent than the amount that destroys the semiconductor device to be protected flows through the wire.

The wire is connected between an opposite pair of leads just as in the case of such semiconductor devices as diodes, transistors and the like. Connection of the wire with the leads may be made by the wire bonding method which is widely used in various semiconductor devices.

The wire and the leads are then packaged in synthetic resin by molding. The resins that can be used for packaging must be incombustible or non-inflammable since heat is produced when the wire is melted and severed or broken. Silicone resins are suitable for the purpose.

The package formed by molding resin to enclose the elements therein may be replaced by a box, a can or a frame having an interior space in which the opposed end portions of a pair of leads and the metallic wire connected therebetween are enclosed.

A fuse is commonly used to break a circuit when overcurrent flows therethrough. Ordinary fuses for low voltages are so standardized that they are melted within two minutes by a current of twice the rated amount. With such a fuse used in connection with a semiconductor device for protection, a current of twice the rated amount can flow through the semiconductor device continuously for a maximum of two minutes, so that the semiconductor device will be destroyed before the fuse is melted.

Furthermore, common fuses, especially those made of alloys having low melting points have great resistances, so that a great power loss is caused by the fuse, with resulting decrease in the power to be supplied to the load. In addition, the resistance and consequently the melting characteristics of the conventional fuses vary widely so that exact breaking operation cannot be expected. For example, a fuse rated to 1 amp. may be used to break a circuit when a current of 2 amp. flows therethrough. The average resistance of the fuses rated to 1 amp. is 0.25 ohm, with a variation (the standard deviation) of 90 milliohms. Such fuses are unstable in melting characteristics and cause a great output loss.

In accordance with the present invention, metals having lower specific resistances, such as gold, silver, copper, etc. are used for the wire. The thin wires made of these metals are used as inner leads in semiconductor devices and have resistances so small that the load loss caused thereby is negligible. The wires made of these metals are melted and severed in a short period of time, preferably within 0.5 second, when a current a little smaller than the excess current that will break the semiconductor device flows through the wires.

The invention will be described in detail with reference to the accompanying drawings, wherein;

FIG. 4 is a top plan view of another embodiment of the invention, wherein the protective element has a pair of metallic wires;

FIG. 5 is a top plan view of a third embodiment of the invention, wherein the leads project from the package in the same direction;

FIG. 6 is a top plan view of a fourth embodiment of the invention, wherein a plurality of protective elements are enclosed in a single package;

FIG. 7 is a top plan view, in transverse section, of a fifth embodiment of the invention, wherein the metallic wire is covered with flexible resin; and FIG. 8 is a side view, in vertical section, of a sixth embodiment of the invention, wherein a case is used as the package; and FIG. 9 is a side view, in vertical section, of a seventh embodiment of the invention, wherein a case having a different form is used as the package.

Figure 1:
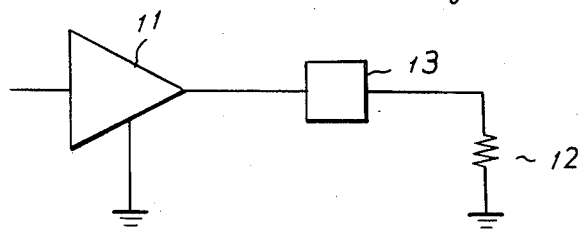
FIG. 1 is a circuit diagram of one embodiment of the invention.

Now turning first to FIG. 1, there is shown a semiconductor device 11 comprising transistors, integrated circuits and so on. The device 11 can be a semiconductor device or circuit at the final stage in the network of, say, an electronic audio system, and the output of the device 11 drives a load 12, say, the speaker of the audio system.

Figure 2:
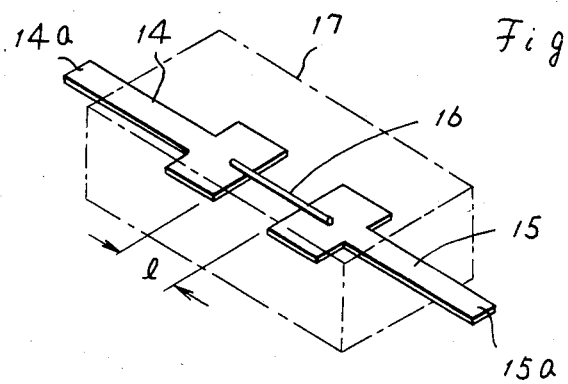
FIG. 2 is a perspective view of a protective element embodying the invention.

A protective element 13 is connected between the output of the semiconductor device 11 and the load 12. As shown in FIG. 2, the protective element 13 comprises a pair of leads 14 and 15, a thin metallic wire 16 connected between the two leads 14 and 15, and a package 17 enclosing the wire and the adjacent end portions of the leads 14 and 15.

The wire 16 is made of a metal which has a sufficiently small specific resistance. For example, a wiere of gold, silver, copper or aluminum, or a wire of silver plated with gold can be used as the wire 16.

The thin metallic wire 16 can be connected to the leads 14 and 15 by the wire bonding method well known and widely used for assembling in semiconductor devices.

The package 17 is made of an incombustible synthetic resin such as silicone resin, which is molded into a package to securely and integrally hold the wire 16 and the opposed end portions of the leads 14 and 15 connected by the wire. The resin must be incombustible because before the metallic wire is melted, it its heated thereby to burn or otherwise damage the package itself.

The outer ends 14a and 15a of the leads 14 and 15 extend out of the package 17 for connection to a printed circuit or the like.

The electrical resistance of the metallic wire 16 is such that when the amount of current which flows from the semiconductor device 11 to the load 12 has become a little smaller than that which would destroy the semiconductor device, the wire is melted instantly, for example, within 0.5 second. The resistance of the wire is determined by the specific resistance of the metal that constitutes the wire and and length and diameter of the wire.

Figure 3:
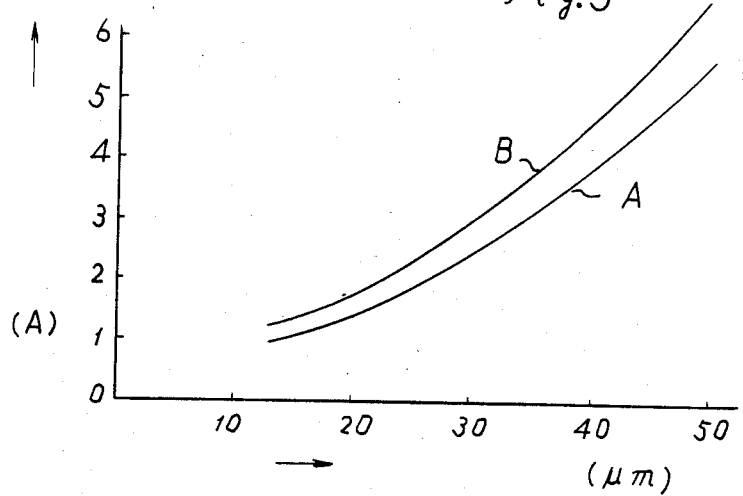
FIG. 3 is a graph of characteristic curves showing the relation between the diameter of the metallic wires and the amount of current that causes the wires to be severed by melting.

FIG. 3 is a graph of characteristic curves showing the relation between the current required for causing the wire to be melted and the diameter of the wire. The curves resulted from the experiments conducted, in which the distance l between the leads 14 and 15 was set to 2.5 mm and the amount of current required for melting the wire in 0.5 second and the diameter of the wire melted were measured. The ambient temperature was 25° C. The curve A resulted from gold wires and the curve B, from silver wires.

As is obvious from the graph, a gold wire having a diameter of 40 $\mu$m is melted in 0.5 second by a current of 4 amp. With a semi-conductor device which is destroyed by a current a little larger than 4 amp., if a gold wire having a diameter of 40 $\mu$m connects the leads 14 and 15 spaced a distance l of 2.5 mm from each other, the wire is melted in 0.5 second by a current of 4 amp. thereby to break the circuit between the load 12 and the semiconductor device 11 for protection of the device against destruction.

If a wire of a single metal, for example, gold and not of alloy has a diameter of 25 $\mu$m, the amount of current that causes the wire to be melted is 2 amp. as shown in FIG. 3. The gold wires of this dimension have an average resistance of 0.12 ohm with a variation (standard deviation) of 4 milliohms. With silver wires of the same diameter, the average resistance is 0.08 ohm with a variation of 3 milliohms.

As compared with fuses made of alloys having lower melting points, the wires of gold or silver have lower resistance values, with smaller variations thereof, so that the melting characteristic of the wires is stable and the loss of the protective device for semiconductor deives is small.

To obtain a large cut off current two metallic wires 16a and 16b may be connected in parallel between the leads 14 and 15, as shown in FIG. 4. More than three such wires may be provided.

In FIGS. 2 and 4 the outer ends 14a and 15a of the leads 14 and 15 project out of the package 17 at the opposite sides thereof. Alternatively, the outer ends 14a and 15a of the leads 14 and 15 may be so arranged as to project out of the package at the same side thereof, as shown in FIG. 5.

When the protective element is to be mounted on a printed circuit board, the leads 14 and 15 must be bent in the structure shown in FIG. 2. With the arrangement of FIG. 5, however, the protective element can conveniently be mounted on a printed circuit board immediately without bending the leads 14 and 15.

In the arrangement of FIG. 6, a plurality of pairs of leads 14 and 15 with a connecting metallic wire 16 in each pair of leads are enclosed in a single package 17. By mounting a single package of this type on a printed circuit board it is possible to use each of the metallic wires as a protective element for one of the many semiconductor devices provided on the same board, without the necessity of providing a protective element for each of the many semiconductor devices.

It is required that the package 17 should securly hold the leads 14 and 15 and the metallic wire 16 for protection of these elements from damage and destruction due to external forces. If the package 17 has been molded of resin, the resin must be so hard after the molding that the resin is securely molded around the metallic wire 16. However, when the metallic wire is melted and severed due to excess cureent, the metal of the wire is first melted by heat at one place along the length of the wire and the wire is cut at that one place, whereupon due to the surface tension of the melted material the cut ends of the wire become rounded to form minute spheres, which grow on until almost all of the wire between the leads 14 and 15 is consumed or disappears. This is a common process in which a metallic wire is melted.

With resin securely molded around the wire, however, when the wire is first melted and cut, the cut ends are prevented by the surrounding resin from becoming rounded due to the surface tension of the melted metal. In the meantime, the temperature of the cut ends lowers so that the metal of the wire can no longer be melted. As a result after the cut ends has been cooled, they appear as if they had been cut with scissors. Actual measurement has disclosed that the gap betwen the cut ends of the wire ranges from 20 to 100 $\mu$m.

Generally, the breakdown voltage of an air gap is about 3000 V/mm. Therefore, if the gap between the cut ends of the wire is 20 $\mu$m wide, the withstand voltage of the gap is about 60 volts. If the protective element is used with a semiconductor device for use with a voltage higher than 60 volts, a voltage impressed across the cut ends of the wire of the protective element will cause a discharge to occur between the cut ends thereby to short the circuit, so that the semiconductor device cannot be protected effectively.

In accordance with the invention, therefore, when a package formed by molding synthetic resin is used, before the package is formed by molding, the wire is covered with a flexible synthetic resin so that when the wire has been melted and cut, the gap between the cut ends will become sufficiently wide, and then a package is formed by molding to enclose the wire and the leads therein. FIG. 7 shows an example of this arrangement, wherein a metallic wire 16 is first covered with an incombustible flexible synthetic resin as at 20.

The flexible resin suitably is a silicone resin (such as R6101 available from Dow Corning Co.) used for coating a junction in integrated circuits or transistors.

After the wire has been covered with the resin, it is cured, say, at 150° C. for 2 hours, and then the package 17 is formed by molding.

With the above arrangement, since the metallic wire 16 is covered with the flexible resin 20, when the wire is melted due to excess currreent, there will be no substantial external force acting to prevent the melted cut ends of the wire from becoming rounded to cause a sufficiently wide gap to be formed between the opposed rounded cut ends. Experiments have disclosed that almost all of the metallic wire is melted away between the leads 14 and 15. The wide gap thus formed betweeen the cut ends of the wire renders the withstand voltage sufficiently high after the severance of the wire thereby to effectively prevent a discharge from occurring across the gap and avoid shorting without fail.

In the above-mentioned embodiments, the package 17 is made of synthetic resin by molding. For molding synthetic resin is introduced under pressure into a mold so that the metallic wire is likely to be cut or broken. Also the metallic wire is sometimes cut or broken due to the stress caused by expansion or contraction of the resin. To prevent the wire from being broken or cut for such causes as mentioned above, the wire must have a certain mechanical strength, so that a wire of aluminum which has a relatively small mechanical strength or a wire of gold or silver which has a relatively small diameter cannot be used in some cases.

In order for the wire to be cut due to a relatively low current, it must have a small diameter, but a protective element for low current cannot be obtained for the above-mentioned reasons.

As previously mentioned, in the package made of resin by molding the gap between the melted cut ends of the metallic wire is narrow. Therefore, in accordance with the invention the wire is covered with flexible synthetic resin so as to make the gap wider when the wire is melted and cut.

Instead of using the package formed by molding synthetic resin, a package in the form of a case as shown in FIGS. 8 and 9 may be used in accordance with the invention.

In the embodiment of FIG. 8 a package 23 in the form of a case comprises a base 21 and a cover 22 to be placed thereon, both of an insulating material such as ceramic material.

The base 21 and the cover 22 are put together by sealing as at 24 with glass having a low melting point, with a pair of leads 25 and 26 extending between the sealed surfaces of the base 21 and the cover 22 to project out of the package 23.

A metallic wire 27 connects the inner ends of the leads 25 and 26, and the wire 27 with the inner ends of the leads are enclosed in a space 28 defined by the base 21 and the cover 22. With the arrangement, when the wire 27 has been melted and cut due to an excess current passing through the wire, the absence of solid material in close contact with the melted cut end portions of the wire causes the cut end portions to be smoothly rounded due to the surface tension of the melted metallic material until almost all length of the wire is melted away.

Since the package is not formed by plastic encapsulation, it never happens that the metallic wire is cut by expansion or contraction when the package is molded. This makes it possible to use a thinner wire than if the package is molded, so that a protective element for use with a lower current, say, 0.1 amp. can easily be made.

In the embodiment of FIG. 9, a base 31 made of metal is formed with a pair of holes 32, through which a pair of leads 33 and 34 are inserted so that the upper ends of the leads project from the upper surface of the base 31. The leads are then fixed by pouring melted glass 34 into a recess formed in the bottom of the base 31.

A cover or can 36 made of metal is put on and sealed to the base 31 to define a space 38 therebetween. A metallic wire 36 is connected to the upper ends of the leads projecting into the space 38, so that the wire 36 is positioned in the space 38.

With this arrangement it never happens that the wire 36 is cut or otherwise damaged during the process of forming the package. When the wire 36 is melted due to excess current, all length of the wire is melted.

Inert gas such as nitrogen ($N_2$) may be put in the spaces 28, 38 in the devices shown in FIGS. 8 and 9.

What I claim is:

1. A protective element for use in a device for protecting a semiconductor device from overcurrent, comprising a package made of a molded synthetic resin, a pair of conductive leads having their inner ends in said package and mounted in spaced apart relation and having their outer ends extending out of said package and being adapted for connection in circuit to a semiconductor device, and a metallic fuse wire connected between said inner ends of said leads wherein each such fuse wire to lead connection is wire bonded, said package of molded synthetic resin comprising a permanently flexible synthetic resin portion surrounding and contacting the surface of said fuse wire and a nonflexible synthetic resin portion encapsulating said flexible resin portion with said fuse wire therewithin, said fuse wire being made from a metal chosen from the group consisting of gold, silver, copper and aluminum, which group is characterized by relatively low specific resistances and relatively high melting points, and said fuse wire having a cross section and length selected such that when a current through said semiconductor device and said fuse wire approaches, but does not reach a predetermined current level known to destroy said semiconductor device, said wire is melted, whereby the melting of said fuse wire occurs more promptly than if made of a metal having a relatively higher specific resistance and relatively lower melting point compared to metals in said group, and said permanently flexible synthetic resin portion supportively protects said fuse wire, prior to melting, from damage due to external mechanical forces and yet flexibly yields to said melting of said fuse wire so as to allow formation of gap widening rounded ends of the melted fuse wire.

2. The protective element of claim 1, wherein said package is made of a synthetic resin by molding, and said metallic fuse wire and said inner ends of said leads are embedded in said molded resin.

3. The protective element of claim 1 wherein said cross section and length of said fuse wire are selected such that as said current approaches said predetermined level said fuse wire is melted in a time equal to or less than 0.5 seconds.

* * * * *